US008062834B2

(12) United States Patent
Lee et al.

(10) Patent No.: US 8,062,834 B2
(45) Date of Patent: Nov. 22, 2011

(54) METHOD FOR MANUFACTURING TRANSPARENT ELECTRODE PATTERN AND METHOD FOR MANUFACTURING ELECTRO-OPTIC DEVICE HAVING THE TRANSPARENT ELECTRODE PATTERN

(75) Inventors: Hyung Sup Lee, Gyeonggi-do (KR); Kyoo Hwan Lee, Gyeonggi-do (KR); Young Ho Kwon, Gyeonggi-do (KR)

(73) Assignee: Jusung Engineering Co. Ltd., Gwangju-si, Gyeonggi-do (KR)

( * ) Notice: Subject to any disclaimer, the term of this patent is extended or adjusted under 35 U.S.C. 154(b) by 398 days.

(21) Appl. No.: 12/344,488

(22) Filed: Dec. 27, 2008

(65) Prior Publication Data
US 2009/0170036 A1    Jul. 2, 2009

(30) Foreign Application Priority Data
Dec. 31, 2007 (KR) .................. 10-2007-0141272

(51) Int. Cl.
*G03F 7/00* (2006.01)
*G03F 7/20* (2006.01)
(52) U.S. Cl. ......... 430/313; 430/308; 430/310; 430/314
(58) Field of Classification Search .................. 430/302, 430/308, 313, 314; 264/400
See application file for complete search history.

(56) References Cited

U.S. PATENT DOCUMENTS

| 5,737,049 A * | 4/1998 | Shin et al. ..................... 349/122 |
| 6,445,428 B1 * | 9/2002 | Fujikawa et al. ............... 349/43 |
| 7,968,458 B2 * | 6/2011 | Chuman et al. ............... 438/658 |
| 2008/0124522 A1 * | 5/2008 | Chuman et al. ............... 428/141 |

FOREIGN PATENT DOCUMENTS

| JP | 63-097922 | 4/1988 |
| JP | 01-246877 | 10/1989 |
| KR | 1020060049490 A | 5/2006 |

* cited by examiner

*Primary Examiner* — Shean Wu
(74) *Attorney, Agent, or Firm* — Portland IP Law LLC (57) ABSTRACT

Provided are a method for manufacturing a transparent electrode pattern and a method for manufacturing an electro-optic device having the transparent electrode pattern. The method for manufacturing the transparent electrode pattern includes forming a transparent electrode on a light-transmissive substrate, patterning the transparent electrode by removing a portion of the transparent electrode, and forming an insulating protective layer in an edge region of the patterned transparent electrode through a printing process. In accordance with the method, the insulating protective layer is formed in the edge region of the patterned transparent electrode through the printing process so that an apparatus and method for manufacturing the insulating protective layer can be simplified, resulting in a decrease in manufacturing cost.

23 Claims, 6 Drawing Sheets

METHOD FOR MANUFACTURING TRANSPARENT ELECTRODE PATTERN AND METHOD FOR MANUFACTURING ELECTRO-OPTIC DEVICE HAVING THE TRANSPARENT ELECTRODE PATTERN

CROSS-REFERENCE TO RELATED APPLICATION

This application claims priority to Korean Patent Application No. 10-2007-0141272 filed on Dec. 31, 2007 and all the benefits accruing therefrom under 35 U.S.C. §119, the contents of which are incorporated by reference in their entirety.

BACKGROUND

The present disclosure relates to a method for manufacturing a transparent electrode pattern and a method for manufacturing an electro-optic device having the transparent electrode pattern, and more particularly, to a method for manufacturing a transparent electrode pattern and a method for manufacturing an electro-optic device having the transparent electrode pattern, in which a transparent electrode is patterned on a light-transmissive substrate and an insulating protective layer covering an edge region of the patterned transparent electrode is formed through a screen printing process.

In general, electro-optic devices are devices of generating electricity using light, or emitting light using electricity. In electro-optic devices, a conductive electrode through which an electrical signal is transferred is necessarily formed. The conductive electrode may be formed of a light-transmissive material that does not block the propagation of light.

Therefore, an electrode of an electro-optic device is formed using a light-transmissive conductive material such as indium tin oxide (ITO) in recent years. In case where die electrode is formed of ITO, an ITO layer is deposited on a light-transmissive substrate through a sputtering process. Thereafter, an ITO electrode pattern is formed through a photolithography process. That is, a photoresist layer is applied on an entire surface of the ITO layer, and a photoresist mask pattern is then formed on the ITO layer through exposure and development. Subsequently, the exposed ITO layer is removed through an etching process using the photoresist mask pattern as an etch mask, and the remaining photoresist mask pattern is then removed to thereby form the ITO electrode pattern.

However, the above-described process of forming the ITO electrode pattern is complicated, and it should be necessary to perform the process of exposing and developing the photoresist layer and the etching process of removing the ITO layer, leading to an increase in manufacturing cost.

To overcome such a limitation, therefore, a technology of forming the ITO electrode pattern by irradiating a laser beam onto the ITO layer formed on a substrate has been recently proposed.

However, when a transparent electrode pattern is formed using the laser beam, it is disadvantageous in that an edge region of the transparent electrode pattern can not be uniformly removed. For this reason, the edge region of the transparent electrode pattern is protected by an insulating protective layer (i.e., protective layer) to prevent characteristics of an electro-optic device from being changed at the edge region of the transparent electrode.

To form the insulating protective layer in the edge region of the transparent electrode pattern, the insulating protective layer should be formed on an entire surface of the substrate through a deposition or coating process, and a portion of the deposited or coated insulating protective layer should be removed through a photolithography process. This necessitates an additional expensive manufacturing apparatus and a complex manufacturing process, causing the productivity of devices to be decreased and the manufacturing cost to be increased.

SUMMARY

The present disclosure provides a method for manufacturing a transparent electrode pattern and a method for manufacturing an electro-optic device having the transparent electrode pattern, which can reduce manufacturing cost and simplify a manufacturing process by coating an edge region of the transparent electrode through a screen printing process.

In accordance with an exemplary embodiment, a method for manufacturing a transparent electrode pattern includes: forming a transparent electrode on a light-transmissive substrate; patterning the transparent electrode by removing a portion of the transparent electrode; and forming an insulating protective layer in an edge region of the patterned transparent electrode through a printing process.

The light-transmissive substrate may be divided into an active region and an inactive region, and the transparent electrode of the inactive region may be removed.

The insulating protective layer may be provided in an edge region of the transparent electrode and the inactive region.

The forming of the insulating protective layer may include: coating the edge region of the transparent electrode with an insulating coating material; and curing the insulating coating material using heat or light.

The coating of the edge region of the transparent electrode with the insulating coating material may include: brining a stencil mask into contact with the substrate where the transparent electrode is formed, the stencil mask exposing the inactive region and the edge region of the transparent electrode; coating the insulating coating material on the stencil mask; and coating the insulating coating material on an exposed region of the stencil mask using a squeeze.

The insulating coating material may include an organic material having fluidity or an inorganic material having fluidity.

The organic material may include photoresist (PR), and the inorganic material may include at least one of piezoelectric ceramic, alumina, oxide and nitride.

The transparent electrode may be patterned using a laser scribing process or patterned using a photolithography process and an etching process.

In accordance with another exemplary embodiment, a method for manufacturing an electro-optic device includes: forming a transparent electrode on a light-transmissive substrate; patterning the transparent electrode by removing a portion of the transparent electrode; forming an insulating protective layer in an edge region of the patterned transparent electrode through a printing process; forming an electro-optic device layer on the patterned transparent electrode; and forming an electrode on the electro-optic device layer.

The forming of the electro-optic device layer may include sequentially forming a hole injection layer, a hole transport layer, an emission layer, an electron transport layer, and an electron injection layer on the patterned transparent electrode.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Hereinafter, specific embodiments will be described in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. In the drawings, like reference numerals denote like elements.

Figure 1A:
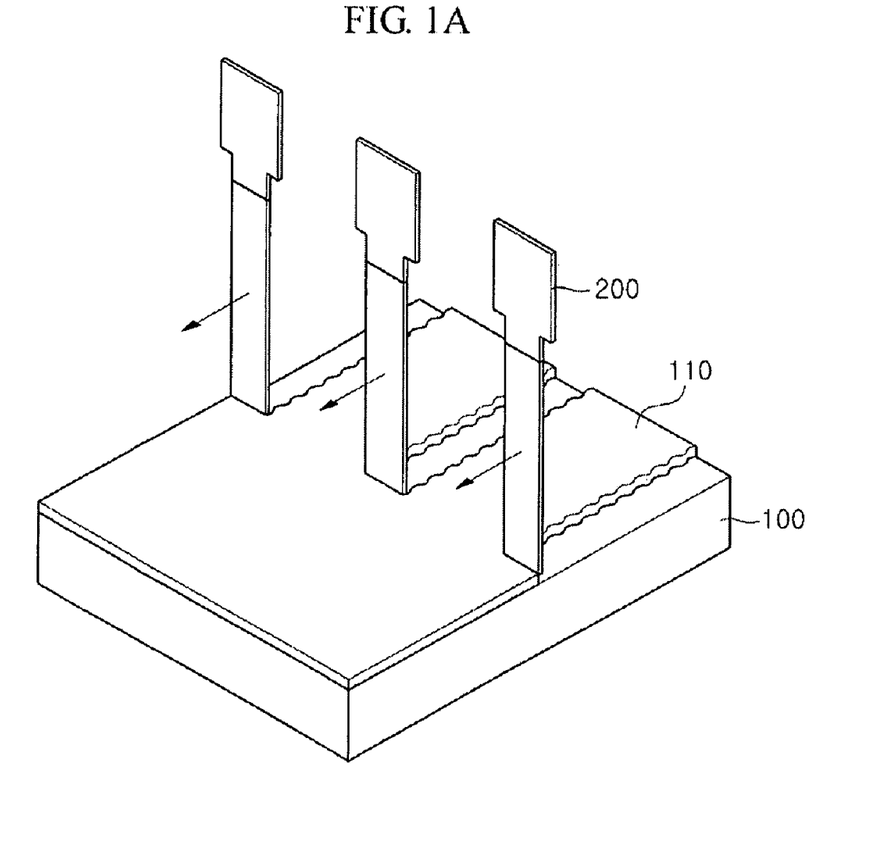
FIGS. 1A, 1B, 2A and 2B illustrate a method for manufacturing a transparent electrode pattern in accordance with an exemplary embodiment.
Figure 1B:
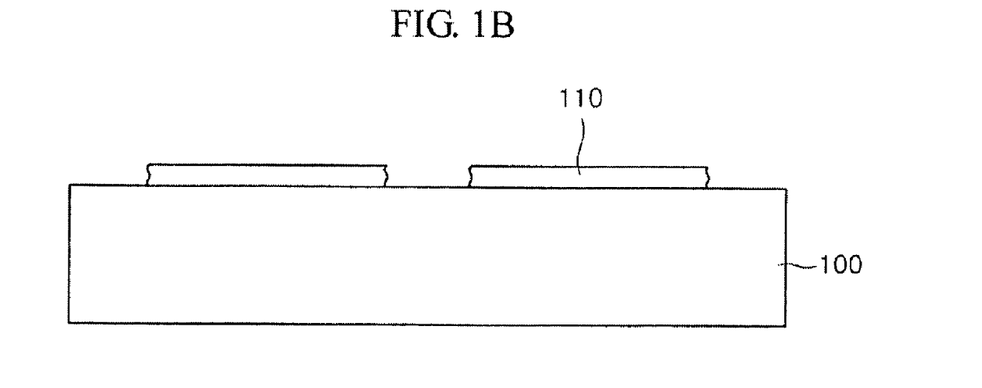
Figure 2A:
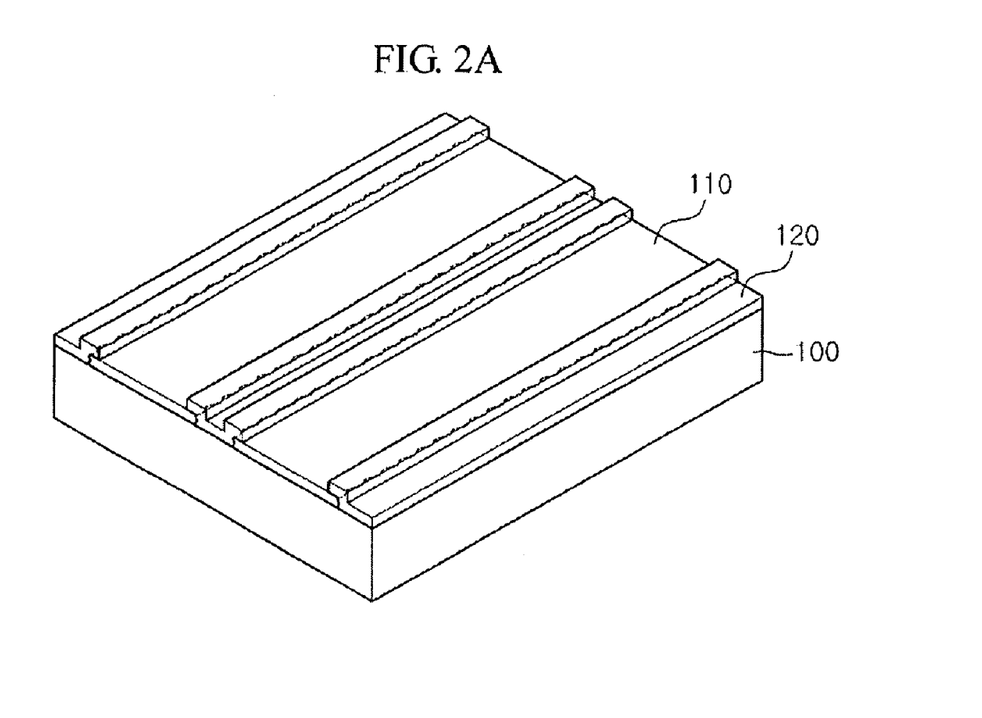
Figure 2B:
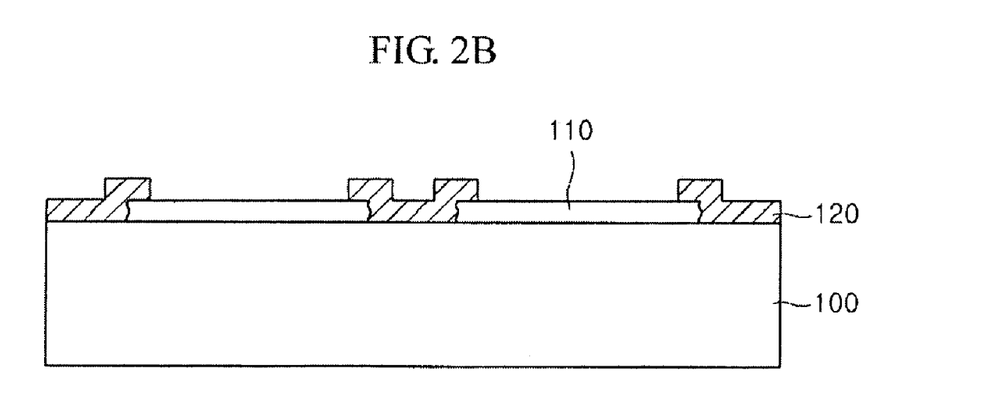
Figure 3A:
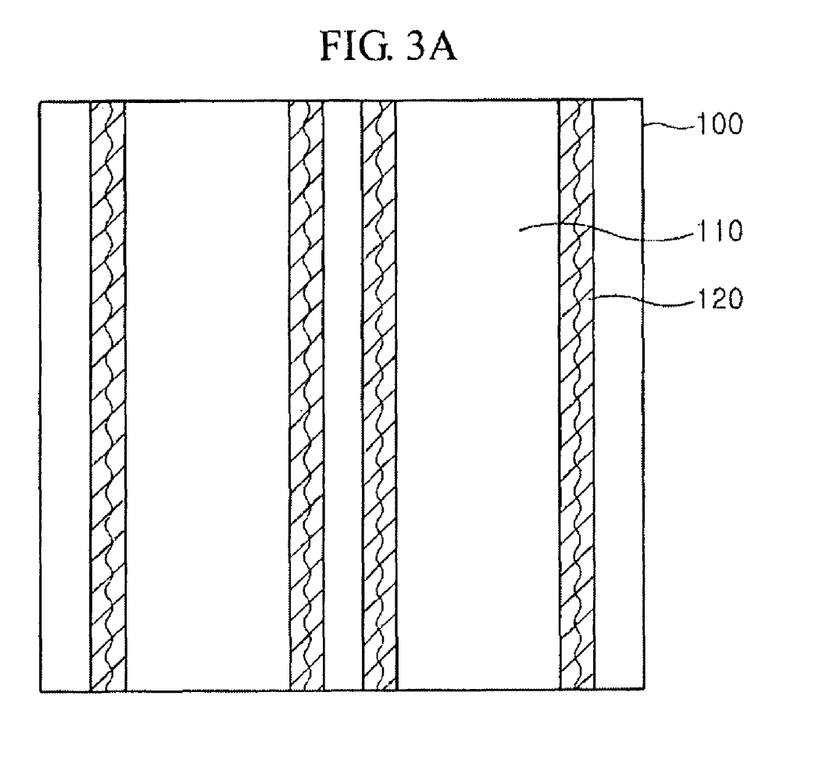
FIGS. 3A and 3B illustrate a method for manufacturing a transparent electrode pattern in accordance with a modification of the exemplary embodiment.
Figure 3B:
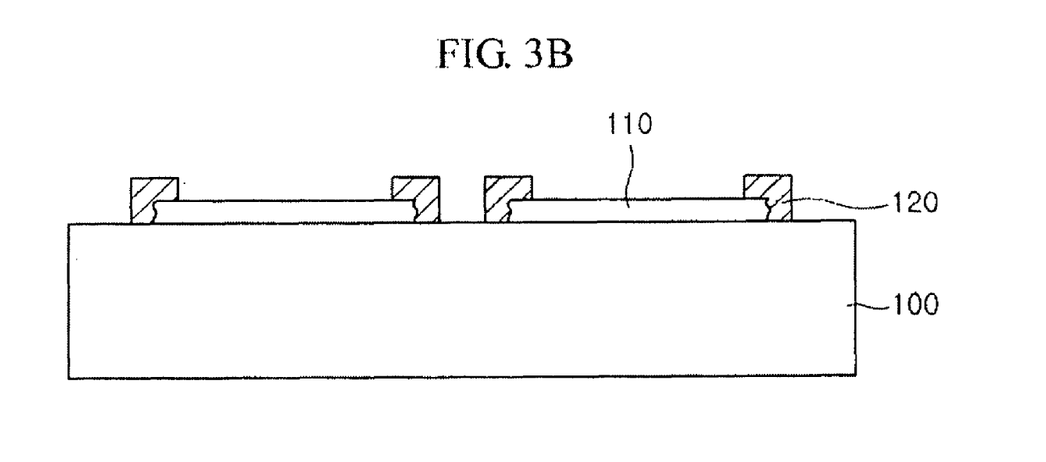

FIGS. 1A, 1B, 2A and 2B illustrate a method for manufacturing a transparent electrode pattern in accordance with an exemplary embodiment. FIGS. 3A and 3B illustrate a method for manufacturing a transparent electrode pattern in accordance with a modification of the exemplary embodiment. FIGS. 4A, 4B, 5A and 5B illustrate a method for manufacturing a transparent electrode pattern in accordance with another modification of the exemplary embodiment.

A method for manufacturing a transparent electrode pattern in accordance with this exemplary embodiment will be described below with reference to FIGS. 1A, 1B, 2A and 2B. Here, FIGS. 1A and 2A are schematic perspective views illustrating a method for manufacturing a transparent electrode pattern, and FIGS. 1B and 2B are sectional views illustrating a method for manufacturing a transparent electrode pattern.

First, referring to FIGS. 1A and 1B, a transparent electrode 110 is formed on a light-transmissive substrate 100.

The light-transmissive substrate 100 may employ a glass or plastic substrate, but is not limited thereto. For instance, a thin silicon substrate or sapphire substrate may also be used for the light-transmissive substrate 100. In this exemplary embodiment, a glass substrate is used as the light-transmissive substrate 100. A transparent electrode 110 is formed on the light-transmissive substrate 100 through a sputtering process, but the forming process of the transparent electrode 110 is not limited to the sputtering process. For example, the transparent electrode 110 may be formed through various deposition processes besides the sputtering process according to the transparent electrode 110. Here, a conductive thin film having light transmittance of 50% or higher is used for the transparent electrode 110. The conductive thin film may include one of indium tin oxide (ITO), indium zinc oxide (IZO), zinc oxide (ZnO), tin oxide (SnO) and indium oxide ($In_2O_3$). In this exemplary embodiment, ITO is used for the transparent electrode 110. Therefore, an ITO layer is formed on a glass substrate through a sputtering process and the transparent electrode 110 is then formed.

Afterwards, as illustrated in FIGS. 1A and 1B, the transparent electrode 110 is patterned by removing a portion of the transparent electrode 110 using a laser 200. That is, the transparent electrode 110 is left remaining on an active region (for example, a region where an electro-optic device will be formed) through a laser scribing process, whereas the transparent electrode 110 of an inactive region is removed. At this time, as illustrated in FIG. 1A, the transparent electrode 110 is patterned by irradiating a laser beam in one direction. Furthermore, the transparent electrode 110 can be formed in a line shape, not a plate shape, on the light-transmissive substrate 100 by patterning the transparent electrode through the laser scribing process, so that power can be uniformly supplied to the entire transparent electrode 110.

When the transparent electrode 110 is patterned through the laser scribing process, an edge portion of the patterned transparent electrode 110 is deformed due to high heat or energy produced during process. This may cause the reliability of the device to be deteriorated if an electro-optic device pattern is formed in the edge region of the transparent electrode 110.

Therefore, as illustrated in FIGS. 2A and 2B, an insulating protective layer 120 is formed in the edge region of the patterned transparent electrode 110 and the substrate 110 from which the transparent electrode 110 is removed. Herein, the insulating protective layer 120 may be formed through a printing process. Through the printing process, the insulating protective layer 120 can be selectively formed in the edge region of the transparent electrode 110. In this exemplary embodiment, a screen printing process is used as the printing process.

That is, a stencil mask exposing the edge region of the transparent electrode 110 is disposed on the substrate 100. Afterwards, an insulating coating material is applied on the stencil mask. At this time, the edge region of the transparent electrode 110 exposed by an opening of the stencil mask is coated with the insulating coating material by spreading the coating material on the stencil mask using the squeeze. Through this coating process, the active region (that is, a central region of the patterned transparent electrode 110) is not coated with the insulating coating material. Subsequently, the stencil mask is removed and then heat is applied or light is irradiated to cure the insulating coating material. Resultantly, the insulating protective layer 120 is formed. Heat may be applied or light may be irradiated differently according to the insulating coating material. Here, the insulating coating material may include an organic material such as photoresist (PR) or an inorganic material such as piezoelectric ceramic (PZT), alumina ($Al_2O_3$), oxide, nitride and the like. The insulating coating material may have fluidity. Accordingly, phase of the insulating coating material may be one of liquid, gel, and paste. The insulating coating material may include a photocurable or thermosetting material.

After the insulating protective layer 120 is formed, a cleaning process is performed to remove impurities from the substrate 100, thereby forming the patterned transparent electrode 110 of which the edge region is protected by the insulating protective layer 120. Herein, the transparent electrode 110 is patterned in a line shape. In this exemplary embodiment, the transparent electrode 110 is patterned through the laser scribing process, and the edge region of the patterned transparent electrode 110 is protected through the screen printing process, thus making it possible to simplify a manufacturing process compared to the related art manufacturing process of forming the insulating protective layer through a photolithography process. In addition, manufacturing facilities can be simplified because only a screen printing apparatus, a heating or light irradiating apparatus, and a cleaning process are used to form the insulating protective layer 120 in the edge region of the patterned transparent electrode 110.

Here, the pattern of the transparent electrode 110 of which the edge region is protected by the insulating protective layer 120 is not limited to the aforesaid shape, but may have various modifications.

That is, as illustrated in FIGS. 3A and 3B, the insulating protective layer 120 may be locally formed only in the edge region of the pattern of the transparent electrode 110, thus reducing the amount of material to be used. Furthermore, when several electro-optic devices are formed on a single substrate, the electro-optic devices are separated by cutting them along the inactive region. In this case, the cutting process may be more easily performed because the insulating protective layer 120 is not provided in a central region of the inactive region.

Figure 4A:
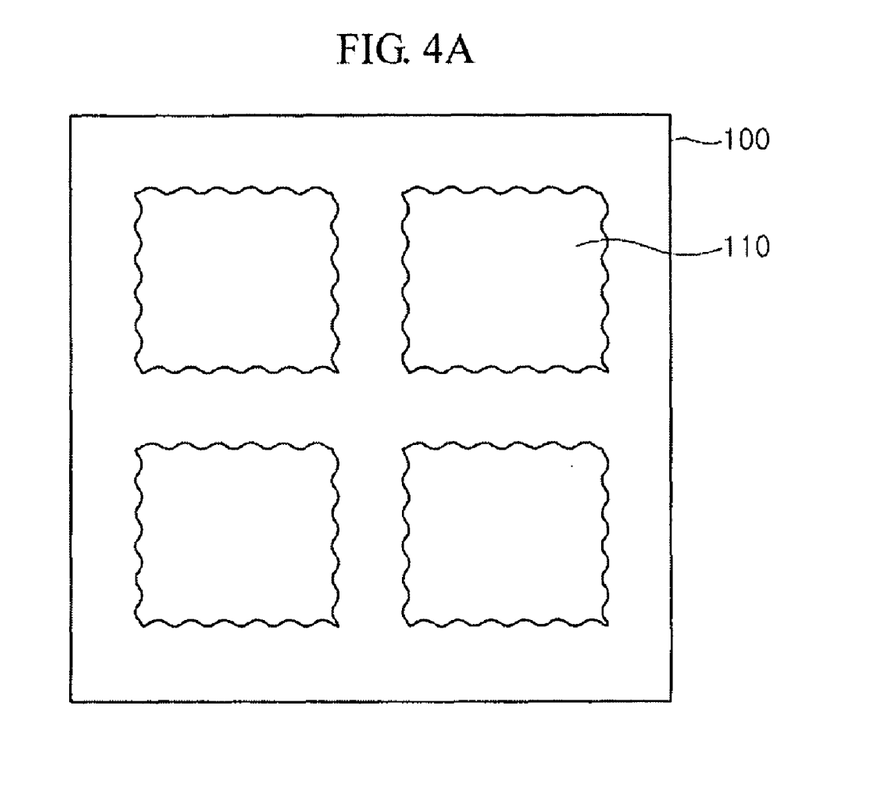
FIGS. 4A, 4B, 5A and 5B illustrate a method for manufacturing a transparent electrode pattern in accordance with another modification of the exemplary embodiment.
Figure 4B:
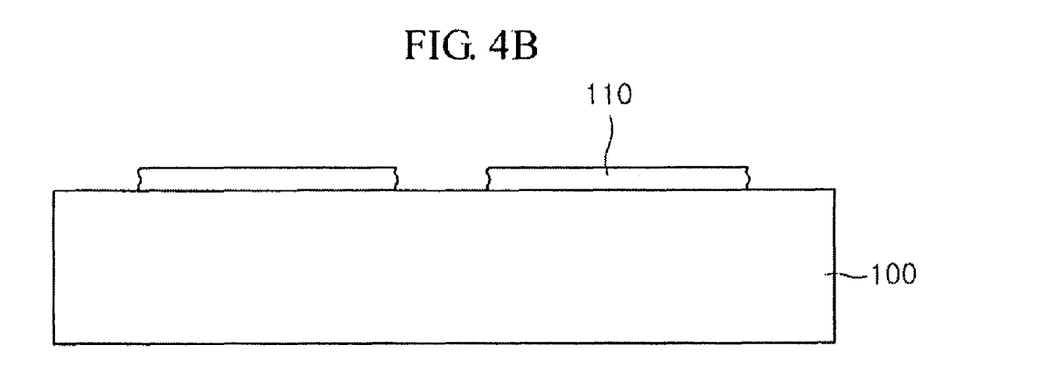
Figure 5A:
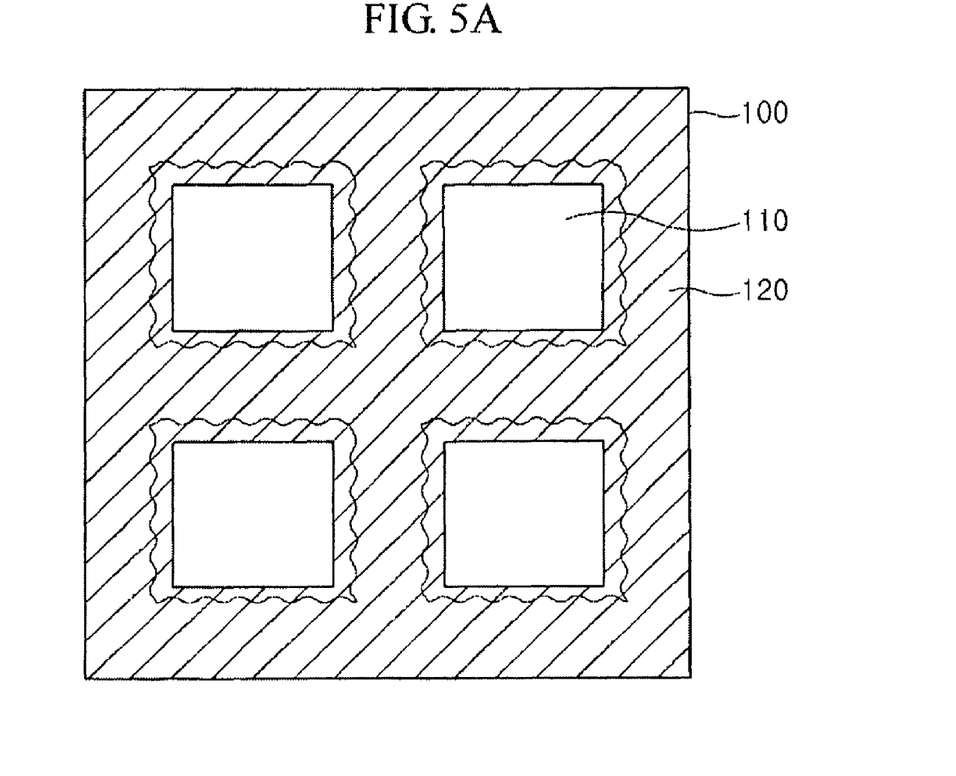
Figure 5B:
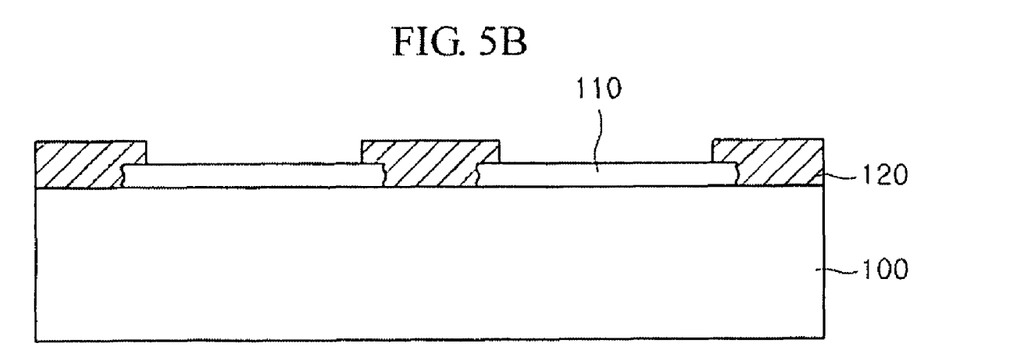

Alternatively, the pattern of the transparent electrode 110 may be formed in the shape of an island, not a straight line, which is illustrated in another modification of FIGS. 4 and 5.

As illustrated in FIGS. 4A and 4B, a pattern of the transparent electrode 110 is formed in the shape or a rectangular island. To this end, the transparent electrode 110 is formed on the light-transmissive substrate 100, and thereafter, the island-like transparent electrode 110 is formed through the laser scribing process. At this time, the island-like transparent electrode 110 may be formed in such a way that the transparent electrode 110 is primarily patterned by moving the laser in a horizontal direction, and is then secondarily patterned by moving the laser in a vertical direction.

A pattern of the island-like transparent electrode 110 is variously changed depending on the shape of the active region. That is, the pattern of the transparent electrode 110 may have the shape of a polygonal island, a circular island, or an elliptical island as well as the rectangular island.

Afterwards, as illustrated in FIGS. 5A and 5B, the insulating protective layer 120 is formed in the edge region of the transparent electrode 110 and the inactive region through the printing process.

Also, this exemplary embodiment is not limited to the above-described process, but the insulating protective layer 120 may be formed by printing the substrate 100 with an insulation ink.

In addition, the transparent electrode 110 may be patterned using a photolithography process and an etching process as well as the laser scribing process. That is, a photoresist mask pattern is formed on the transparent electrode 110 through the photolithography process. The photoresist mask pattern formed on the transparent electrode 110 exposes the transparent electrode 110 of the inactive region. Thereafter, the exposed transparent electrode 110 is removed through an etching process using the photoresist mask pattern as an etch mask. Subsequently, the transparent electrode 110 is patterned by removing the remaining photoresist mask pattern. Here, the etching process may be a wet etch or dry etch.

Herebelow, description will be made on a method for manufacturing an electro-optic device using the method for manufacturing the transparent electrode pattern in which the insulating protective layer is formed in the edge region.

Figure 6:
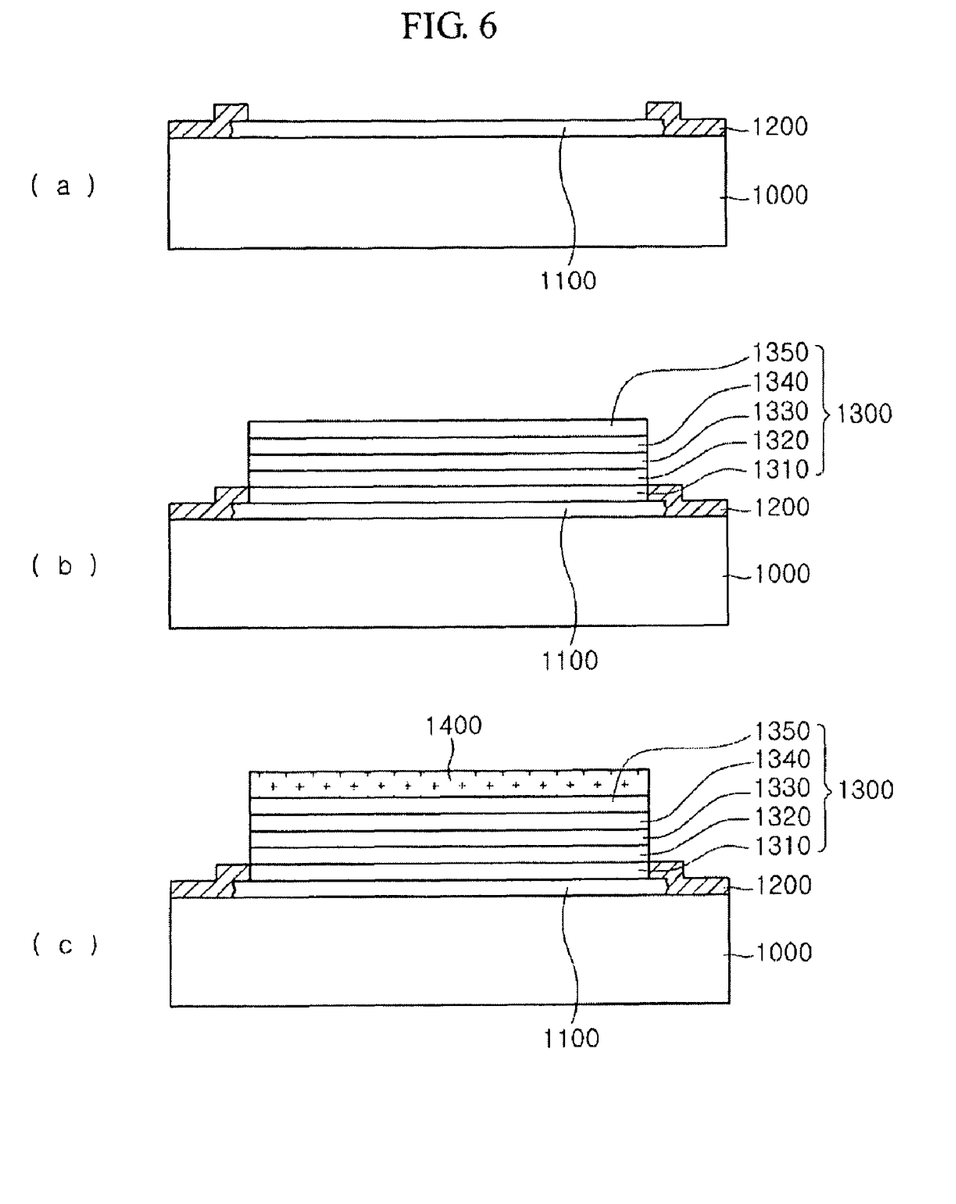
FIGS. 6(a) through 6(c) are sectional views illustrating a method for manufacturing an organic light emitting device in accordance with an exemplary embodiment.

FIGS. 6(a) through 6(c) are sectional views illustrating a method for manufacturing an organic light emitting device in accordance with an exemplary embodiment.

Referring to FIG. 6(a), a transparent conductive material is deposited on a light-transmissive substrate 1000, and then patterned to form a bottom transparent electrode 1100 through a laser scribing process. An insulating protective layer 1200 is formed in an edge region of the bottom transparent electrode 1100 through a printing process.

Referring to FIG. 6(b), an organic emitting layer 1300 is formed on the bottom transparent electrode 1100.

To be specific, a hole injection layer (HIL) 1310, a hole transport layer (HTL) 1320, an emitting layer (EML) 1330, an electron transport layer (ETL) 1340, and an electron injection layer (EIL) 1350 are sequentially formed on the bottom transparent electrode 1100 to thereby form the organic emitting layer 1300.

The hole injection layer 1310 is obtained by forming an organic layer, e.g., CuPc or MTDATA, on the bottom transparent electrode 1100. The hole transport layer 1320 is obtained by forming an organic layer such as NPB and TPD on the hole injection layer 1310. The emitting layer 1330 is formed on the hole transport layer 1320. The emitting layer 1330 may be one of a green emitting layer including $Alq_3$ or $Alq_3$:C545T, a red emitting layer including $Alq_3$:DCJTB, a blue emitting layer including SAlq or DPVBi, and combinations thereof. The electron transport layer 1340 is obtained by forming a material layer such as $Alq_3$ on the emitting layer 1330. The organic emitting layer 1300 may be formed by forming a material layer such as LiF, BCP:Cs or the like on the electron transport layer 1340.

Afterwards, as illustrated in FIG. 6(c), a top electrode 1400 is formed on the organic emitting layer 1300.

That is, the top electrode 1400 is formed by depositing a metallic material on the organic emitting layer 1300 through a sputtering process. Here, the metallic material may include one selected from the group consisting of aluminum (Al), silver (Ag), copper (Cu) and an alloy including at least one of the foregoings, but is not limited thereto. A transparent electrode may be used as the top electrode 1400.

Of course, the technology of the present invention is not limited to the aforesaid electro-optic device where the edge region of the transparent electrode is protected by the insulating protective layer that is formed through the printing process, but may also be applicable to various electro-optic devices. The present invention can be variously applied depending on an electro-optic device (i.e., organic emitting layer, light conversion layer) formed on the transparent electrode. For example, the present invention may be applicable to various kinds of electro-optic devices such as an optical sensor, a solar cell and a light-emitting diode.

In accordance with the present invention, an insulating protective layer is formed in an edge region of a patterned transparent electrode through a printing process so that an apparatus and method for manufacturing the insulating protective layer can be simplified, resulting in a decrease in manufacturing cost.

Although the method for manufacturing the transparent electrode pattern and the method for manufacturing the electro-optic device having the transparent electrode pattern have been described with reference to the specific embodiments, they are not limited thereto. Therefore, it will be readily understood by those skilled in the art that various modifications and changes can be made thereto without departing from the spirit and scope of the present invention defined by the appended claims.

What is claimed is:

1. A method for manufacturing an electro-optic device, the method comprising:
    forming a transparent electrode on a light-transmissive substrate;
    patterning the transparent electrode by removing a portion of the transparent electrode;
    forming an insulating protective layer in an edge region of the patterned transparent electrode through a printing process;
    forming an electro-optic device layer on the patterned transparent electrode; and forming an electrode on the electro-optic device layer;
wherein the forming of the electro-optic device layer comprises sequentially forming a hole injection layer, a hole transport layer, an emission layer, an electron transport layer, and an electron injection layer on the patterned transparent electrode.

2. The method of claim 1, wherein the light-transmissive substrate is divided into an active region and an inactive region, and the transparent electrode on the inactive region of the light-transmissive substrate is removed.

3. The method of claim 2, wherein the transparent electrode comprises a conductive thin film having a light transmittance of 50% or higher.

4. The method of claim 3, wherein the transparent electrode comprises a material selected from the group consisting of indium tin oxide (ITO), indium zinc oxide (IZO), zinc oxide (ZnO), tin oxide (SnO), indium oxide ($In_2O_3$), and combinations thereof.

5. The method of claim 2, wherein the insulating protective layer is provided in the edge region of the patterned transparent electrode and the inactive region.

6. The method of claim 5, wherein the forming of the insulating protective layer comprises:
coating the edge region of the patterned transparent electrode with an insulating coating material; and
curing the insulating coating material using heat or light.

7. The method of claim 6, wherein the coating of the edge region of the patterned transparent electrode with the insulating coating material comprises:
bringing a stencil mask into contact with the substrate where the transparent electrode is formed, the stencil mask exposing the inactive region and the edge region of the transparent electrode;
coating the insulating coating material on the stencil mask; and
coating the insulating coating material on an exposed region of the stencil mask.

8. The method of claim 7, wherein the insulating coating material comprises an organic material having fluidity or an inorganic material having fluidity.

9. The method of claim 8, wherein the insulating coating material is cured by heating or light irradiating.

10. The method of claim 8, wherein the organic material comprises photoresist (PR), and the inorganic material comprises a material selected from the group consisting of piezoelectric ceramic, alumina, oxide, nitride and combinations thereof.

11. The method of claim 1, wherein the transparent electrode is patterned using a laser scribing process or patterned using a photolithography process and an etching process.

12. The method of claim 1, further comprises cleaning the substrate to remove impurities from the substrate after the insulating protective layer is formed.

13. The method of claim 1, wherein the electrode comprises a metallic material or a transparent conductive material.

14. The method of claim 13, wherein the metallic material may include one selected from the group consisting of aluminum (Al), silver (Ag), copper (Cu) and an alloy including at least one of the foregoings.

15. An electro-optic device, the comprising:
a light-transmissive substrate divided into an active region and an inactive region;
a transparent electrode formed on the active region of the light-transmissive substrate;
an insulating protective layer formed on an edge region of the transparent electrode;
an electro-optic device layer formed on the transparent electrode; and
an electrode formed on the electro-optic device layer,
wherein the electro-optic device layer comprises sequentially forming a hole injection layer, a hole transport layer, an emission layer, an electron transport layer, and an electron injection layer.

16. The device of claim 15, wherein the transparent electrode comprises a conductive thin film having a light transmittance of 50% or higher.

17. The device of claim 16, wherein the transparent electrode comprises a material selected from the group consisting of indium tin oxide (ITO), indium zinc oxide (IZO), zinc oxide (ZnO), tin oxide (SnO), indium oxide ($In_2O_3$) and combinations thereof.

18. The device of claim 15, wherein the insulating protective layer is provided in an edge region of the patterned transparent electrode and the inactive region.

19. The device of claim 15, wherein the insulating coating material comprises an organic material having fluidity or an inorganic material having fluidity.

20. The device of claim 19, wherein the insulating coating material is cured by heating or light irradiating.

21. The device of claim 20, wherein the organic material comprises photoresist (PR), and the inorganic material comprises a material selected from the group consisting of piezoelectric ceramic, alumina, oxide, nitride and combinations thereof.

22. The device of claim 15, wherein the electrode comprises a metallic material or a transparent conductive material.

23. The device of claim 22, wherein the metallic material may include one selected from the group consisting of aluminum (Al), silver (Ag), copper (Cu) and an alloy including at least one of the foregoings.

* * * * *